(12) United States Patent
Kang

(10) Patent No.: US 12,310,240 B2
(45) Date of Patent: May 20, 2025

(54) THERMOELECTRIC ELEMENT

(71) Applicant: LG INNOTEK CO., LTD., Seoul (KR)

(72) Inventor: In Seok Kang, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 103 days.

(21) Appl. No.: 18/024,374

(22) PCT Filed: Sep. 2, 2021

(86) PCT No.: PCT/KR2021/011824
§ 371 (c)(1),
(2) Date: Mar. 2, 2023

(87) PCT Pub. No.: WO2022/050707
PCT Pub. Date: Mar. 10, 2022

(65) Prior Publication Data
US 2024/0032427 A1 Jan. 25, 2024

(30) Foreign Application Priority Data
Sep. 3, 2020 (KR) .................. 10-2020-0112169

(51) Int. Cl.
*H10N 10/817* (2023.01)
(52) U.S. Cl.
CPC ................................ *H10N 10/817* (2023.02)
(58) Field of Classification Search
CPC .................................................... H10N 10/817
See application file for complete search history.

(56) References Cited

U.S. PATENT DOCUMENTS

| | | | |
|---|---|---|---|
| 2011/0274888 A1 | 11/2011 | Tang et al. | |
| 2014/0150839 A1 | 6/2014 | Hershberger et al. | |
| 2017/0301851 A1* | 10/2017 | Angermann | H10N 10/17 |
| 2017/0317261 A1* | 11/2017 | Ozturk | H10N 10/80 |

(Continued)

FOREIGN PATENT DOCUMENTS

| | | |
|---|---|---|
| JP | H07-321378 | 12/1995 |
| KR | 10-2010-0025067 | 3/2010 |
| KR | 10-2011-0081889 | 7/2011 |

(Continued)

OTHER PUBLICATIONS

International Search Report (with English Translation) dated Dec. 1, 2021 issued in Application No. PCT/KR2021/011824.

(Continued)

*Primary Examiner* — Jayne L Mershon
(74) *Attorney, Agent, or Firm* — KED & ASSOCIATES, LLP

(57) ABSTRACT

A thermoelectric element according to one embodiment of the present invention comprises: a first electrode; a metal layer arranged on the first electrode; a semiconductor structure arranged on the metal layer; and a conductive bonding layer arranged between the first electrode and the metal layer, wherein: the metal layer includes one surface facing the conductive bonding layer, and another surface facing the semiconductor structure; the one surface includes a plurality of recesses recessed toward the other surface; and the plurality of recesses extend in a first direction.

18 Claims, 7 Drawing Sheets

(56) References Cited

U.S. PATENT DOCUMENTS

2018/0033938 A1\* 2/2018 Lee .................. H10N 10/81
2021/0083165 A1\* 3/2021 Jo ................... H10N 10/82

FOREIGN PATENT DOCUMENTS

| KR | 10-2012-0029196 | 3/2012 |
| KR | 10-2017-0012119 | 2/2017 |
| KR | 10-2017-0136456 | 12/2017 |
| KR | 10-2019-0088702 | 7/2019 |
| KR | 10-2020-0034983 | 4/2020 |

OTHER PUBLICATIONS

Korean Office Action dated Feb. 12, 2025, issued in Application No. 10-2020-0112169.

\* cited by examiner (a)

(b)

THERMOELECTRIC ELEMENT

CROSS-REFERENCE TO RELATED PATENT APPLICATIONS

This application is a U.S. National Stage Application under 35 U.S.C. § 371 of PCT Application No. PCT/KR2021/011824, filed Sep. 2, 2021, which claims priority to Korean Patent Application No. 10-2020-0112169, filed Sep. 3, 2020, whose entire disclosures are hereby incorporated by reference.

TECHNICAL FIELD

The present invention relates to a thermoelectric element, and more particularly, to bonding of a thermoelectric element.

BACKGROUND ART

A thermoelectric phenomenon is a phenomenon occurring due to movement of electrons and holes in a material and means direct energy conversion between heat and electricity.

A thermoelectric element is a generic term for elements using the thermoelectric phenomenon and has a structure in which P-type thermoelectric materials and N-type thermoelectric materials are joined between metal electrodes to form PN junction pairs.

The thermoelectric elements may be classified into elements which use a temperature change of electrical resistance, elements which use the Seebeck effect in which an electromotive force is generated due to a difference in temperature, and elements which use the Peltier effect in which heat absorption or heating occurs due to a current. The thermoelectric elements are being variously applied to home appliances, electronic components, communication components, and the like. For example, the thermoelectric elements may be applied to cooling elements, heating elements, power generation elements, and the like. Accordingly, the demand for thermoelectric performance of the thermoelectric elements is gradually increasing.

The thermoelectric element includes substrates, electrodes, and semiconductor structures, wherein a plurality of semiconductor structures are arranged in an array form between an upper substrate and a lower substrate, a plurality of upper electrodes are arranged between the plurality of semiconductor structures and the upper substrate, and a plurality of lower electrodes are arranged between the plurality of semiconductor structures and the lower substrate. In this case, one of the upper substrate and the lower substrate may be a low-temperature portion, and the other may be a high-temperature portion.

Meanwhile, in order to stably bond the semiconductor structures to the electrodes, a metal layer can be formed between the semiconductor structures and the electrodes. In this case, when stress is generated in a partial region of the thermoelectric element due to thermal expansion of the substrate, a crack can be generated between the semiconductor structure and the metal layer. Specifically, when adhesion between the semiconductor structure and the metal layer is not good, the possibility of generation of cracks between the semiconductor structure and the metal layer further increases, and accordingly, the performance and reliability of the thermoelectric element can be deteriorated.

DISCLOSURE

Technical Problem

The present invention is directed to providing a thermoelectric element whose thermoelectric performance is improved.

Technical Solution

A thermoelectric element according to one embodiment of the present invention includes: a first electrode; a metal layer arranged on the first electrode; a semiconductor structure arranged on the metal layer; and a conductive bonding layer arranged between the first electrode and the metal layer, wherein the metal layer includes one surface facing the conductive bonding layer, and the other surface facing the semiconductor structure, the one surface includes a plurality of recesses concave toward the other surface, and each of the plurality of recesses extends in a first direction.

The first direction may be a direction perpendicular to a second direction from the first electrode to the semiconductor structure.

An arithmetic average roughness (Ra) of the plurality of recesses may be 0.6 to 1.2 μm, and a ten-point average roughness (Rz) may be 5.1 to 6.5 μm.

A surface of the conductive bonding layer facing the metal layer may be arranged in the plurality of recesses to be curved along a shape of the plurality of recesses.

The thermoelectric element may further include: a first substrate; and a first insulating layer arranged between the first substrate and the first electrode.

A portion of the first electrode may be embedded in the first insulating layer.

A surface of the first insulating layer facing the first electrode may include a first recess and a second recess, and the first electrode may be arranged in the first recess.

A depth of the second recess may be shallower than a depth of the first recess.

The plurality of recesses of the metal layer may be arranged to vertically overlap the first recess of the first insulating layer.

The plurality of recesses of the metal layer may be arranged not to vertically overlap the second recess of the first insulating layer.

The thermoelectric element may further include a second electrode arranged on the semiconductor structure, a second insulating layer arranged on the second electrode, and a second substrate arranged on the second insulating layer.

The other surface may be concave toward the one surface, and include a plurality of recesses extending in the first direction, and at least one of the arithmetic average roughness (Ra) and the ten-point average roughness (Rz) of the plurality of recesses of the one surface may be different from at least one of the arithmetic average roughness (Ra) and the ten-point average roughness (Rz) of the plurality of recesses of the other surface.

A thermoelectric element according to another embodiment of the present invention includes: a first substrate; a first electrode arranged on the first substrate; a conductive bonding layer arranged on the first electrode; and a semiconductor structure arranged on the conductive bonding layer, wherein a first surface of the semiconductor structure arranged to face the first electrode is a concavo-convex surface having a plurality of recesses formed to regularly extend in the first direction, and a surface of the conductive bonding layer arranged to face the semiconductor structure is arranged to be bent in the plurality of recesses along a concavo-convex shape of the concavo-convex surface.

Irregularities shallower than depths of the plurality of recesses may be formed on wall surfaces of the plurality of recesses.

The thermoelectric element may further include a metal layer arranged between the conductive bonding layer and the semiconductor structure, wherein the metal layer may include one surface facing the conductive bonding layer and the other surface facing the semiconductor structure, and a plurality of recesses may be formed in each of the one surface and the other surface to regularly extend in the first direction.

Advantageous Effects

According to an embodiment of the present invention, a thermoelectric element having excellent performance and high reliability can be acquired. Specifically, according to the embodiment of the present invention, a thermoelectric element having high thermoelectric performance can be acquired by improving the adhesion between a semiconductor structure and a metal layer.

A thermoelectric element according to the embodiment of the present invention can be applied to an application implemented in a large size such as a vehicle, a ship, a steel mill, an incinerator, and the like as well as an application implemented in a small size.

MODES OF THE INVENTION

Hereinafter, exemplary embodiments of the present invention will be described in detail with reference to the accompanying drawings.

However, the technical spirit of the present invention is not limited to some embodiments which will be described and may be embodied in various forms, and one or more elements in the embodiments may be selectively combined and replaced to be used within the scope of the technical spirit of the present invention.

Further, the terms used in the embodiments of the present invention (including technical and scientific terms), may be interpreted with meanings that are generally understood by those skilled in the art unless particularly defined and described, and terms which are generally used, such as terms defined in a dictionary, may be understood in consideration of their contextual meanings in the related art.

Further, the terms used in the embodiments of the present invention are provided only to describe embodiments of the present invention and not for purposes of limitation.

In the present specification, unless clearly indicated otherwise by the context, singular forms include the plural forms thereof, and in a case in which "at least one (or one or more) among A, B, and C" is described, this may include at least one combination among all possible combinations of A, B, and C.

Further, terms such as first, second, A, B, (a), (b), and the like may be used to describe elements of the embodiments of the present invention.

These terms are only provided to distinguish a corresponding element from other elements, and the essence, sequence, order, or the like of the corresponding element is not limited by the terms.

In addition, when an element is described as being "connected," "coupled," or "linked" to another element, the element may include not only a case of being directly connected, coupled, or linked to another element but also a case of being connected, coupled, or linked to another element by still another element between the element and another element.

Further, when an element is described as being formed "on (above)" or "under (below)" another element, the term "on (above)" or "under (below)" includes a case in which two elements are in direct contact with each other or a case in which one or more elements are arranged between two elements (indirect contact). In addition, when an element is described as being arranged "on or under" another element, such a description may include a case in which the element is arranged at an upper side or a lower side based on another element.

Figure 1:
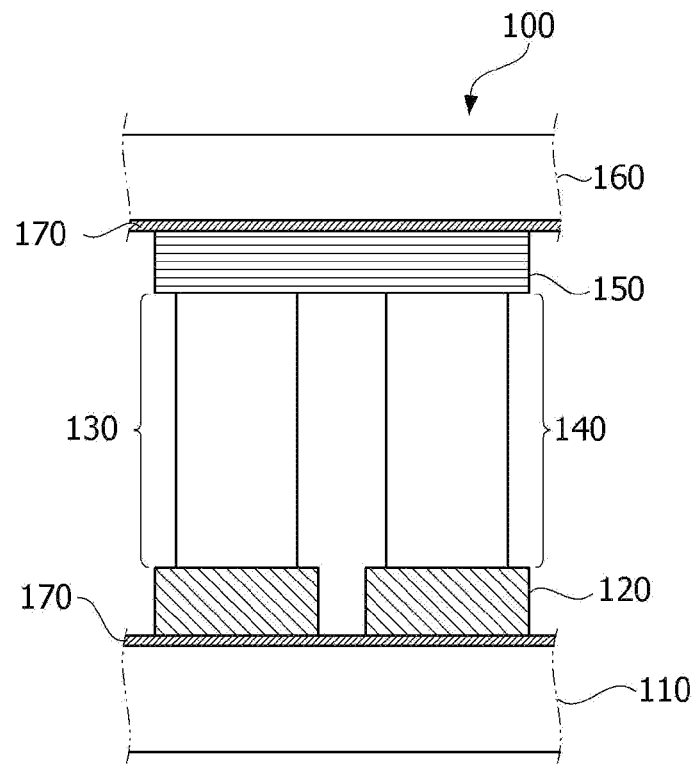
FIG. 1 is a cross-sectional view of a thermoelectric element.
Figure 2:
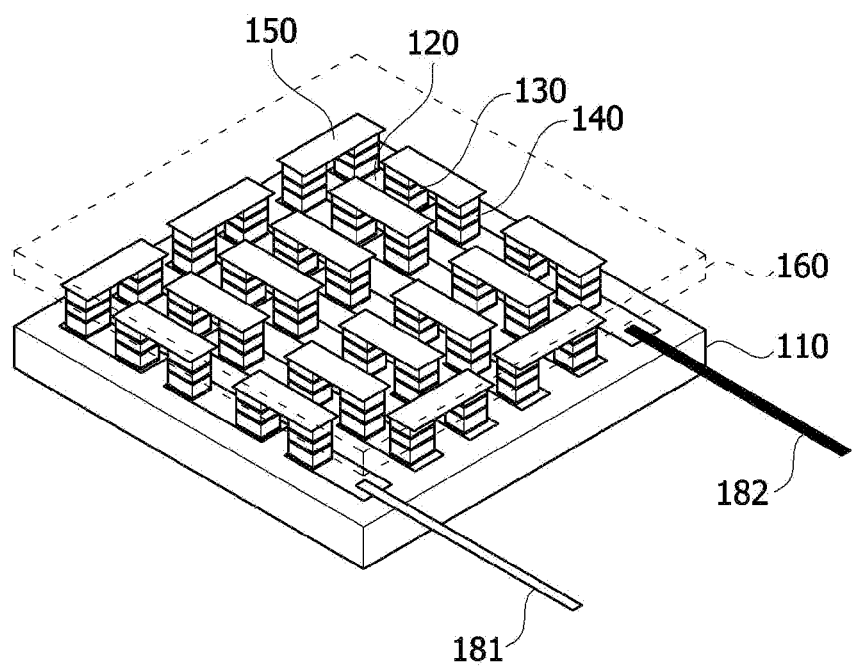
FIG. 2 is a perspective view of the thermoelectric element.
Figure 3:
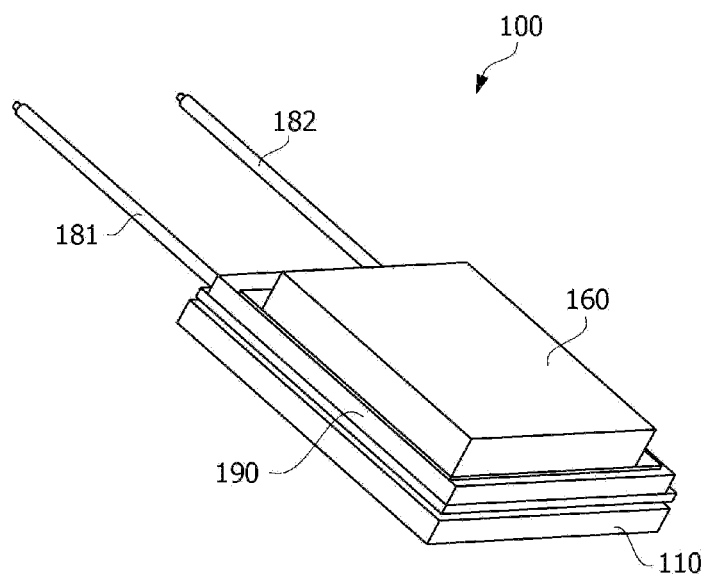
FIG. 3 is a perspective view of the thermoelectric element including a sealing member.
Figure 4:
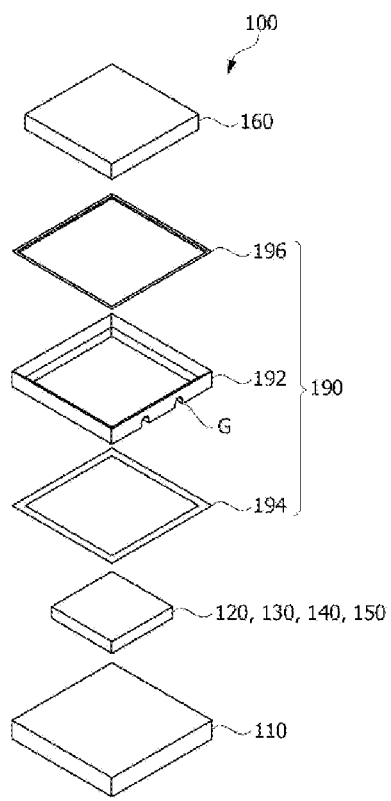
FIG. 4 is an exploded perspective view of the thermoelectric element including the sealing member.

FIG. 1 is a cross-sectional view of a thermoelectric element, and FIG. 2 is a perspective view of the thermoelectric element. FIG. 3 is a perspective view of the thermoelectric element including a sealing member, and FIG. 4 is an exploded perspective view of the thermoelectric element including the sealing member.

Referring to FIGS. 1 and 2, a thermoelectric element 100 includes a lower substrate 110, lower electrodes 120, P-type thermoelectric legs 130, N-type thermoelectric legs 140, upper electrodes 150, and an upper substrate 160.

The lower electrodes 120 are arranged between the lower substrate 110 and lower bottom surfaces of the P-type thermoelectric legs 130 and the N-type thermoelectric legs 140, and the upper electrodes 150 are arranged between the upper substrate 160 and upper bottom surfaces of the P-type thermoelectric legs 130 and the N-type thermoelectric legs 140. Accordingly, a plurality of P-type thermoelectric legs 130 and a plurality of N-type thermoelectric legs 140 are electrically connected by the lower electrodes 120 and the upper electrodes 150. A pair of the P-type thermoelectric leg 130 and the N-type thermoelectric leg 140, which are arranged between the lower electrode 120 and the upper electrode 150 and electrically connected to each other, may form a unit cell.

For example, when a voltage is applied between the lower electrode 120 and the upper electrode 150 through lead lines 181 and 182, due to the Peltier effect, the substrate through which current flows from the P-type thermoelectric leg 130 to the N-type thermoelectric leg 140 may absorb heat and thus act as a cooling unit, and the substrate through which current flows from the N-type thermoelectric leg 140 to the P-type thermoelectric leg 130 may be heated and act as a heating unit. Alternatively, when a temperature difference is provided between the lower electrode 120 and the upper electrode 150, due to the Seebeck effect, charges in the P-type thermoelectric leg 130 and the N-type thermoelectric leg 140 move, and thus electricity may be generated.

Although FIGS. 1 to 4 illustrate that the lead lines 181 and 182 are illustrated as being arranged on the lower substrate 110, the present invention is not limited thereto, and the lead lines 181 and 182 may be arranged on the upper substrate 160, or one of the lead lines 181 and 182 may be arranged on the lower substrate 110 and the other may be arranged on the upper substrate 160.

Here, the P-type thermoelectric leg 130 and the N-type thermoelectric leg 140 may be bismuth-telluride (Bi—Te)-based thermoelectric legs including bismuth (Bi) and tellurium (Te) as main raw materials. The P-type thermoelectric leg 130 may be a Bi—Te-based thermoelectric leg including at least one among antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may include a Bi—Sb—Te, which is a main raw material, in an amount of 99 to 99.999 wt % and may include at least one among nickel (Ni), aluminum (Al), copper (Cu), silver (Ag), lead (Pb), boron (B), gallium (Ga), and indium (In) in an amount of 0.001 to 1 wt % based on the total weight of 100 wt %. The N-type thermoelectric leg 140 may be a Bi—Te-based thermoelectric leg including at least one among selenium (Se), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may include Bi—Se—Te, which is a main raw material, in an amount of 99 to 99.999 wt % and may include at least one among nickel (Ni), aluminum (Al), copper (Cu), silver (Ag), lead (Pb), boron (B), gallium (Ga), and indium (In) in an amount of 0.001 to 1 wt % based on the total weight of 100 wt %. Accordingly, in the present specification, the thermoelectric leg may be referred to as a semiconductor structure, a semiconductor element, a semiconductor substance layer, a semiconductor material layer, a conductive semiconductor structure, a thermoelectric structure, a thermoelectric substance layer, a thermoelectric material layer, or the like.

The P-type thermoelectric leg 130 and the N-type thermoelectric leg 140 may be formed in a bulk type or a stacked type. In general, the bulk type P-type thermoelectric leg 130 or the bulk type N-type thermoelectric leg 140 may be obtained through a process of heat-treating a thermoelectric material to manufacture an ingot, pulverizing and sieving the ingot to obtain powder for a thermoelectric leg, sintering the powder, and cutting a sintered body. In this case, the P-type thermoelectric leg 130 and the N-type thermoelectric leg 140 may be polycrystalline thermoelectric legs. Like the above, when the P-type thermoelectric leg 130 and the N-type thermoelectric leg 140 are polycrystalline thermoelectric legs, the strength of each of the P-type thermoelectric leg 130 and the N-type thermoelectric leg 140 may be increased. The stacked type P-type thermoelectric leg 130 or the stacked type N-type thermoelectric leg 140 may be obtained through a process of coating a sheet-shaped base with a paste including a thermoelectric material to form unit members, stacking the unit members, and cutting the stacked unit members.

In this case, the pair of P-type thermoelectric leg 130 and N-type thermoelectric leg 140 may have the same shape and volume or may have different shapes and volumes. For example, since electrical conduction properties of the P-type thermoelectric leg 130 and the N-type thermoelectric leg 140 are different, a height or sectional area of the N-type thermoelectric leg 140 may be formed to be different from that of the P-type thermoelectric leg 130.

In this case, the P-type thermoelectric leg 130 or the N-type thermoelectric leg 140 may have a cylindrical shape, a polygonal columnar shape, an elliptical columnar shape, or the like.

Alternatively, the P-type thermoelectric leg 130 or the N-type thermoelectric leg 140 may have a stacked type structure. For example, the P-type thermoelectric leg or the N-type thermoelectric leg may be formed by a method of stacking a plurality of structures each having a sheet-shaped base coated with a semiconductor material and then cutting the plurality of structures. Thus, it is possible to prevent material loss and improve electrical conduction properties. Each of the structures may further include a conductive layer having an opening pattern, thereby increasing adhesion between the structures, lowering thermal conductivity, and increasing electrical conductivity.

Alternatively, the P-type thermoelectric leg 130 or the N-type thermoelectric leg 140 may be formed such that sectional areas thereof are different within one thermoelectric leg. For example, in one thermoelectric leg, sectional areas of both end portions each arranged to face the electrode may be formed to be greater than a sectional area between the both end portions. Accordingly, since a great temperature difference may be formed between the both end portions, thermoelectric efficiency may be increased.

The performance of the thermoelectric element according to one embodiment of the present invention may be expressed as a thermoelectric figure of merit (ZT). The thermoelectric figure of merit (ZT) may be expressed as in Equation 1.

$$ZT = \alpha^2 \cdot \sigma \cdot T/k \quad \text{[Equation 1]}$$

Here, α denotes the Seebeck coefficient [V/K], σ denotes electrical conductivity [S/m], and a $\alpha^2\sigma$ denotes a power factor [W/mK²]. Further, T denotes temperature, and k denotes thermal conductivity [W/mK]. k may be expressed as a·cp·ρ, wherein a denotes thermal diffusivity [cm²/S], cp denotes specific heat [J/gK], and ρ denotes density [g/cm³].

In order to acquire the thermoelectric figure of merit of the thermoelectric element, a Z value (V/K) may be measured using a Z meter, and the thermoelectric figure of merit (ZT) may be calculated using the measured Z value.

Here, each of the lower electrodes 120 arranged between the lower substrate 110 and the P-type thermoelectric leg 130 and the N-type thermoelectric leg 140 and the upper electrode 150 arranged between the upper substrate 160 and the P-type thermoelectric leg 130 and the N-type thermoelectric leg 140 may include at least one of copper (Cu), silver (Ag), aluminum (Al), and nickel (Ni), and may have a thickness of 0.01 mm to 0.3 mm. When the thickness of the lower electrode 120 or the upper electrode 150 is smaller than 0.01 mm, the function as an electrode may be deteriorated and the electrical conduction performance may be lowered, and when the thickness of the lower electrode 120 or the upper electrode 150 exceeds 0.3 mm, heat conduction efficiency transferred to the thermoelectric leg 140 may be lowered due to an increase in thermal resistance.

Further, the lower substrate 110 and the upper substrate 160 opposite each other may be metal substrates, and each thickness thereof may be 0.1 mm to 1.5 mm. When the thickness of the metal substrate is smaller than 0.1 mm or exceeds 1.5 mm, since heat dissipation characteristics or thermal conductivity may be excessively high, the reliability of the thermoelectric element may be deteriorated. Further, when the lower substrate 110 and the upper substrate 160 are metal substrates, insulating layers 170 may be further formed between the lower substrate 110 and the lower electrode 120 and between the upper substrate 160 and the upper electrode 150. Each of the insulating layers 170 may include a material having a thermal conductivity of 1 to 20 W/mK.

In this case, the lower substrate 110 and the upper substrate 160 may be formed to have different sizes. For example, a volume, thickness, or area of one of the lower substrate 110 and the upper substrate 160 may be formed to be greater than a volume, thickness, or area of the other. Accordingly, it is possible to improve the heat absorption performance or heat dissipation performance of the thermoelectric element. For example, at least one of a volume, a thickness, and an area of a substrate arranged in a high temperature region for the Seebeck effect, applied as a heating region for the Peltier effect, or on which a sealing member for protecting a thermoelectric module from an external environment is arranged may be greater than at least one of a volume, a thickness, and an area of the other substrate.

Further, a heat dissipation pattern, for example, a concavo-convex pattern may be formed on the surface of at least one of the lower substrate 110 and the upper substrate 160. Accordingly, the heat dissipation performance of the thermoelectric element may be improved. When the concavo-convex pattern is formed on the surface which comes into contact with the P-type thermoelectric leg 130 or the N-type thermoelectric leg 140, bonding characteristics between the thermoelectric leg and the substrate may also be improved. The thermoelectric element 100 includes the lower substrate 110, the lower electrodes 120, the P-type thermoelectric legs 130, the N-type thermoelectric legs 140, the upper electrodes 150, and the upper substrate 160.

As shown in FIGS. 3 and 4, a sealing member 190 may be further arranged between the lower substrate 110 and the upper substrate 160. The sealing member 190 may be arranged on side surfaces of the lower electrodes 120, the P-type thermoelectric legs 130, the N-type thermoelectric legs 140, and the upper electrodes 150 between the lower substrate 110 and the upper substrate 160. Accordingly, the lower electrodes 120, the P-type thermoelectric legs 130, the N-type thermoelectric legs 140, and the upper electrodes 150 may be sealed from external moisture, heat, contamination, and the like. Here, the sealing member 190 may include a sealing case 192 arranged to be spaced apart a predetermined distance from outermost side surfaces of the plurality of lower electrodes 120, the plurality of P-type thermoelectric legs 130 and the plurality of N-type thermoelectric legs 140, and the plurality of upper electrodes 150, a sealing material 194 arranged between the sealing case 192 and the lower substrate 110, and a sealing material 196 arranged between the sealing case 192 and the upper substrate 160. Like the above, the sealing case 192 may come into contact with the lower substrate 110 and the upper substrate 160 through the sealing materials 194 and 196. Accordingly, when the sealing case 192 comes into direct contact with the lower substrate 110 and the upper substrate 160, heat conduction occurs through the sealing case 192, and as a result, a problem in that a temperature difference between the lower substrate 110 and the upper substrate 160 is lowered may be prevented. Here, the sealing materials 194 and 196 may include at least one of an epoxy resin and a silicone resin, or a tape in which at least one of the epoxy resin and the silicone resin is applied on both surfaces. The sealing materials 194 and 194 may serve to seal between the sealing case 192 and the lower substrate 110 and between the sealing case 192 and the upper substrate 160, may improve a sealing effect of the lower electrodes 120, the P-type thermoelectric legs 130, the N-type thermoelectric legs 140, and the upper electrodes 150, and may be used interchangeably with a finishing material, a finishing layer, a waterproofing material, a waterproofing layer, and the like. Here, the sealing material 194 which seals between the sealing case 192 and the lower substrate 110 is arranged on an upper surface of the lower substrate 110, and the sealing material 196 which seals between the sealing case 192 and the upper substrate 160 may be arranged on side surfaces of the upper substrate 160. Meanwhile, guide grooves G for drawing out the lead lines 180 and 182 connected to the electrodes may be formed in the sealing case 192. To this end, the sealing case 192 may be an injection-molded product formed of plastic or the like, and may be used interchangeably with a sealing cover. However, the above description of the sealing member is only an example, and the sealing member may be modified into various forms. Although not shown in the drawings, a thermal insulating material may be further included to surround the sealing member. Alternatively, the sealing member may include a thermal insulating component.

In the above, although the terms "lower substrate 110, lower electrode 120, upper electrode 150, and upper substrate 160" are used, these are only arbitrarily referred to as upper and lower portions for ease of understanding and convenience of description, and positions may be reversed so that the lower substrate 110 and the lower electrode 120 may be arranged at an upper portion, and the upper electrode 150 and the upper substrate 160 may be arranged at a lower portion.

Figure 5:
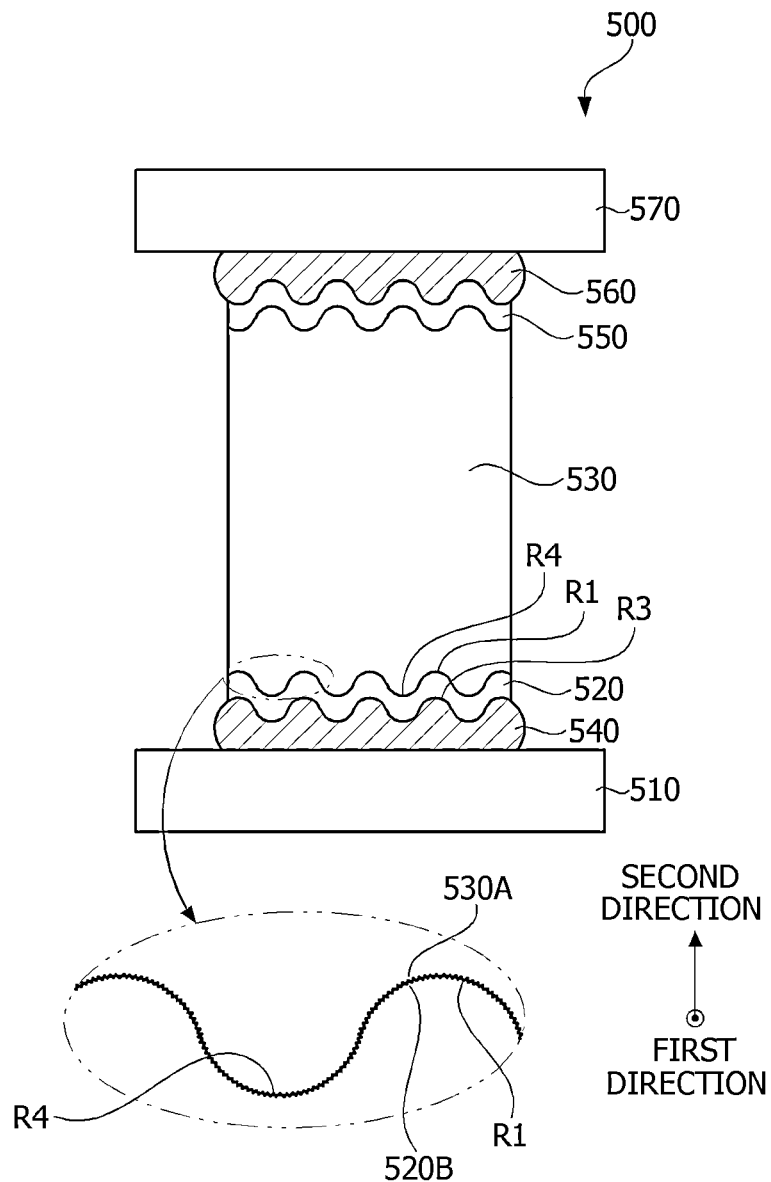
FIG. 5 is a cross-sectional view of a bonding structure between electrodes and a semiconductor structure in a thermoelectric element according to one embodiment of the present invention.
Figure 6:
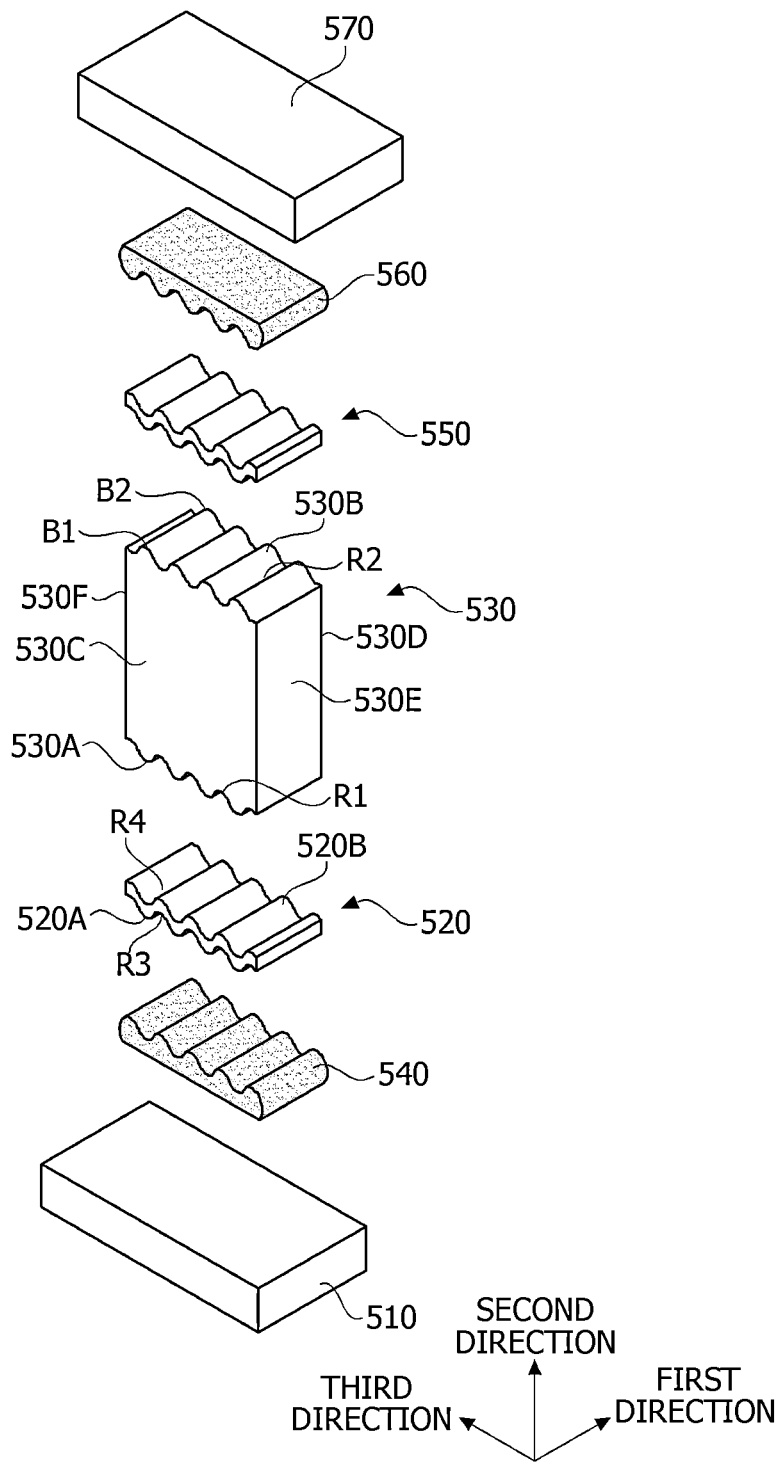
FIG. 6 is an exploded perspective view of the electrodes and the semiconductor structure in the thermoelectric element according to one embodiment of the present invention.
Figure 7:
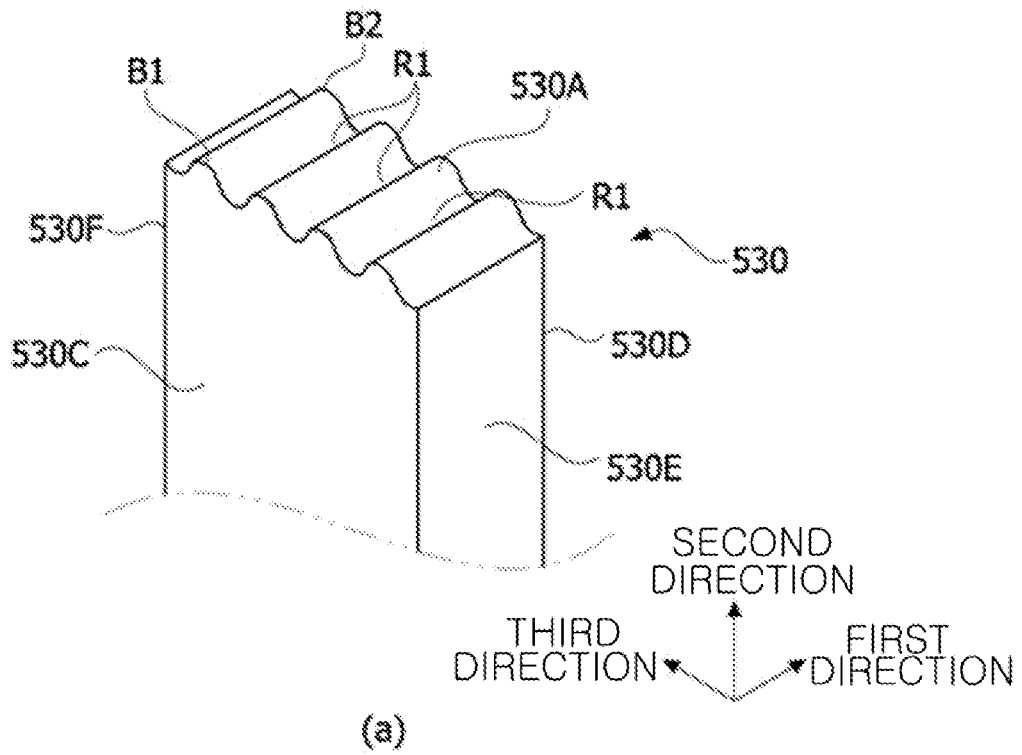
FIG. 7 is a partial perspective view of the semiconductor structure in the thermoelectric element according to one embodiment of the present invention.
Figure 7:
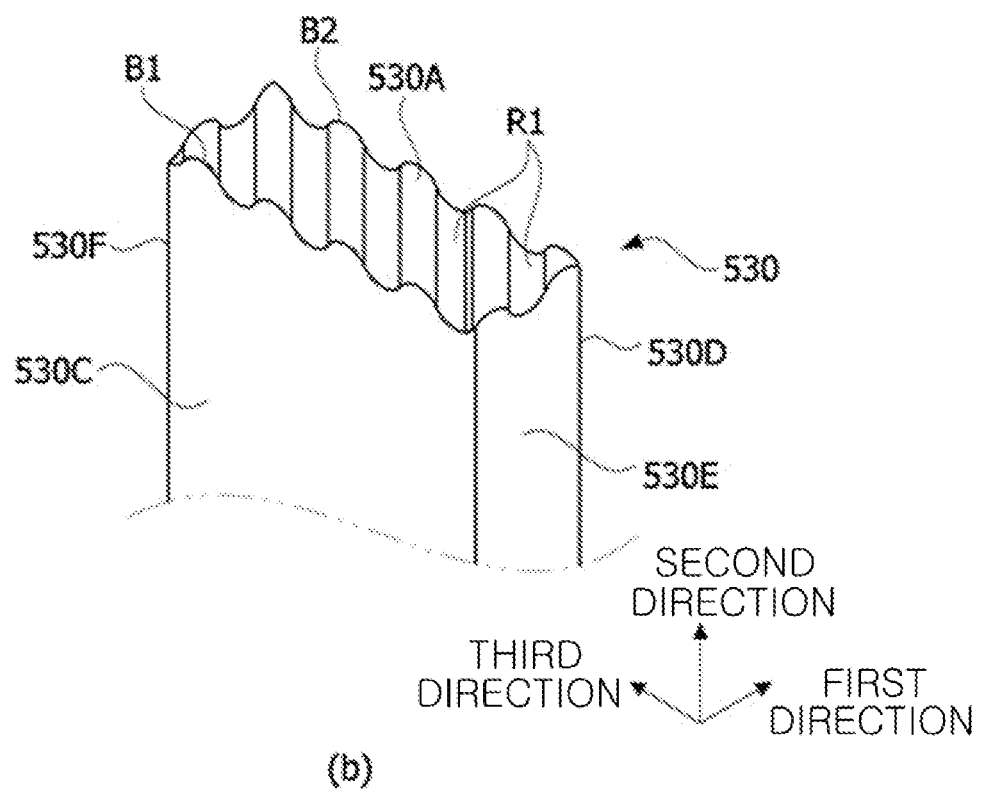

FIG. 5 is a cross-sectional view of a bonding structure between electrodes and a semiconductor structure in a thermoelectric element according to one embodiment of the present invention, FIG. 6 is an exploded perspective view of the electrodes and the semiconductor structure in the thermoelectric element according to one embodiment of the present invention, and FIG. 7 is a partial perspective view of the semiconductor structure in the thermoelectric element according to one embodiment of the present invention. Overlapping descriptions of the same content as the content described in FIGS. 1 to 4 will be omitted.

Referring to FIGS. 5 and 6, a thermoelectric element 500 includes a first substrate (not shown), a first insulating layer (not shown) arranged on the first substrate (not shown), a first electrode 510 arranged on the first insulating layer (not shown), a first metal layer 520 arranged on the first electrode 510, a semiconductor structure 530 arranged on the first metal layer 520, and a first conductive bonding layer 540 arranged between the first electrode 510 and the first metal layer 520. Further, a second metal layer 550, a second conductive bonding layer 560, a second electrode 570, a second insulating layer (not shown), and a second substrate (not shown) may be sequentially stacked on the semiconductor structure 530. Descriptions of the first substrate 110, the insulating layer 170, the first electrodes 120, the thermoelectric legs 130 and 140, the second electrodes 150, the insulating layer 170, and the second substrate 160 in FIGS. 1 to 4 may be equally applied to the first substrate (not shown), the first insulating layer (not shown), the first electrode 510, the semiconductor structure 530, the second electrode 570, the second insulating layer (not shown), and the second substrate (not shown), respectively. The semiconductor structure 530 may be the P-type thermoelectric leg 130 or the N-type thermoelectric leg 140 in FIGS. 1 to 4. For convenience of description, a bonding structure between the first electrode 510 and the semiconductor structure 530 will be mainly described, but the same description may also be applied to a bonding structure between the semiconductor structure 530 and the second electrode 570. Although not shown in FIGS. 5 and 6, a plurality of semiconductor structures may be arranged on one electrode.

According to the embodiment of the present invention, the first electrode 510 and the semiconductor structure 530 may be bonded by the first conductive bonding layer 540. The first conductive bonding layer 540 may include, for example, at least one of tin (Sn), antimony (Sb), and a compound including the same, but is not limited thereto, and may include at least one of bismuth (Bi), silver (Ag), copper (Cu), lead (Pb), and a compound including the same, and may be referred to as a solder layer. A thickness of the first conductive bonding layer 540 may be 30 μm to 120 μm, and preferably 40 μm to 110 μm. When the thickness of the first conductive bonding layer 540 satisfies these numerical ranges, the first electrode 510 and the semiconductor structure 530 may be stably bonded.

Meanwhile, the first metal layer 520 may be arranged between the first conductive bonding layer 540 and the semiconductor structure 530. The first metal layer 520 may include at least one of nickel (Ni), tin (Sn), palladium (Pd), and molybdenum (Mo). Since the first metal layer 520 prevents the diffusion of a semiconductor material, for example, Bi or Te, in the semiconductor structure 530 in a direction toward the first electrode 510, performance deterioration of the thermoelectric element may be prevented, and since wettability with the first conductive bonding layer 540 is excellent, bonding strength between the first electrode 510 and the semiconductor structure 530 may be improved.

The first metal layer 520 may be plated, for example, electroless-plated, on one surface of the semiconductor structure 530, and accordingly, may be referred to as a plated layer.

Here, a total thickness of the first metal layer 520 may be 10 to 80 μm, preferably 20 to 60 μm, and more preferably 25 to 40 μm.

According to the embodiment of the present invention, in the semiconductor structure 530, at least one of a first surface 530A arranged to face the first electrode 510 and a second surface 530B arranged to face the second electrode 570 is a concave-convex surface in which a plurality of recesses R1 and R2 are formed to extend along a first direction. For example, referring to FIG. 7, the plurality of recesses R1 may be formed to be parallel to each other and regularly extend along the first direction. Here, the first direction may be a direction perpendicular to a second direction from the first electrode 510 to the semiconductor structure 530.

When the semiconductor structure 530 includes a third surface 530C between the first surface 530A and the second surface 530B, a fourth surface 530D which is a surface opposite the third surface 530C, and a fifth surface 530E between the first surface 530A and the second surface 530B, and a sixth surface 530F which is a surface opposite the fifth surface 530E, a boundary line B1 between the first surface 530A and the third surface 530C may have a curved shape in which peaks and valleys are regularly repeated. Here, regular repetition of the peaks and the valleys may refer to a periodic shape in which the same pitch and height are repeated.

Here, the first direction in which the plurality of recesses R1 and R2 extend may be a direction parallel to the fifth surface 530E, may be a direction parallel to the third surface 530C, or may be a direction not parallel to the third surface 530C and the fifth surface 530E. In order to improve the adhesion between the semiconductor structure 530 and the first and second metal layers 520 and 550, and adhesion between the first and second metal layers 520 and 550 and first and second conductive adhesive layers 540 and 560 to be described below, the first direction in which the plurality of recesses R1 and R2 extend may be arranged parallel to or non-parallel to the third to sixth surfaces 530C, 530D, 530E, and 530F.

For example, as shown in FIG. 7A, the first direction in which the plurality of recesses R1 and R2 extend may be a direction parallel to a direction from the third surface 530C to the fourth surface 530D. Accordingly, the boundary line B1 between the first surface 530A and the third surface 530C may have a curved shape in which peaks and valleys are regularly repeated, and a boundary line between the first surface 530A and the fifth surface 530E may have a straight line shape. Alternatively, as shown in FIG. 7B, the first direction in which the plurality of recesses R1 and R2 extend may be a direction not parallel to the direction from the third surface 530C to the fourth surface 530D. That is, the first direction in which the plurality of recesses R1 and R2 extend may be a diagonal direction having a predetermined angle with respect to the direction from the third surface 530C to the fourth surface 530D. Accordingly, not only the boundary line B1 between the first surface 530A and the third surface 530C but also the boundary line between the first surface 530A and the fifth surface 530E may have a curved shape in which peaks and valleys are regularly repeated.

Further, the boundary line B1 between the first surface 530A and the third surface 530C may correspond to a boundary line B2 between the first surface 530A and the fourth surface 530D. That is, on the first surface 530A, the peak of the curved shape of the boundary line B1 between the first surface 530A and the third surface 530C and the peak of the curved shape of the boundary line B2 between the first surface 530A and the fourth surface 530D may extend to each other, and the valley of the curved shape of the boundary line B1 between the first surface 530A and the third surface 530C and the valley of the curved shape of the boundary line B2 between the first surface 530A and the fourth surface 530D may extend to each other.

Like the above, according to the embodiment of the present invention, the first metal layer 520 includes one surface 520A facing the first conductive bonding layer 540 and the other surface 520B facing the semiconductor structure 530, the one surface 520A includes a plurality of recesses R3 extending along the first direction and concave toward the other surface 520B, and the other surface 520B includes a plurality of recesses R4 extending along the first direction and concave toward the one surface 520A. That is, the plurality of recesses R3 and R4 may have the same direction and shape as the plurality of recesses R1 formed in the first surface 530A of the semiconductor structure 530.

Like the above, when the plurality of recesses R1 formed in the first surface 530A of the semiconductor structure 530 and the plurality of recesses R4 formed in the other surface 520B of the first metal layer 520 are formed to correspond to each other, the bonding area between the first surface 530A of the semiconductor structure 530 and the other surface 520B of the first metal layer 520 may increase, and accordingly, adhesion between the semiconductor structure 530 and the first metal layer 520 may be improved, and the possibility of generation of a crack between the semiconductor structure 530 and the first metal layer 520 due to thermal expansion of the thermoelectric element may be reduced. Further, when the plurality of recesses R1 formed in the first surface 530A of the semiconductor structure 530 and the plurality of recesses R4 formed in the other surface 520B of the first metal layer 520 are formed to regularly extend in the first direction, since a bonding surface between the semiconductor structure 530 and the first metal layer 520 has uniform adhesion as a whole, the possibility of generation of a crack between the semiconductor structure 530 and the first metal layer 520 due to a partial region having weak adhesion may be reduced.

According to the embodiment of the present invention, for both of the plurality of recesses R1 formed in the first surface 530A of the semiconductor structure 530 and the plurality of recesses R4 formed in the other surface 520B of the first metal layer 520, a surface roughness (Ra) may be 0.6. µm to 1.2 µm, preferably 0.7 µm to 1.1 µm, and more preferably 0.8 µm to 1.05 µm, and a surface roughness (Rz) may be 5.1 µm to 6.5 µm, preferably 5.15 µm to 6.4 µm, and more preferably 5.5 µm to 6.35 µm. When the surface roughness (Ra) and the surface roughness (Rz) of the plurality of recesses R1 formed in the first surface 530A of the semiconductor structure 530 and the plurality of recesses R4 formed in the other surface 520B of the first metal layer 520 are within these numerical ranges, the bonding area between the first surface 530A of the semiconductor structure 530 and the other surface 520B of the first metal layer 520 may increase, and accordingly, the adhesion between the semiconductor structure 530 and the first metal layer 520 may be improved, and the possibility of generation of a crack between the semiconductor structure 530 and the first metal layer 520 due to the thermal expansion of the thermoelectric element may be reduced.

Here, the surface roughness may be measured using a surface roughness meter and may be referred to as a surface profile. The surface roughness meter may measure a cross-sectional curve using a probe, and calculate the surface roughness using a peak line, a valley line, an average line, and a reference length of the cross-sectional curve. In the present specification, the surface roughness may refer to an arithmetic average roughness (Ra) by a center line average calculation method. That is, in the present specification, the arithmetic average roughness (Ra) may refer to an average value of absolute values of lengths from the center line of a profile surface to the cross-sectional curve within a reference length L. The arithmetic average roughness (Ra) may be acquired through the following Equation 2.

$$R_a = \frac{1}{L}\int_0^L |f(x)|dx \qquad \text{[Equation 2]}$$

That is, when the cross-sectional curve acquired using the probe of the surface roughness meter is extracted as much as the reference length L and expressed as a function (f(x)) with an average line direction set as an x-axis and a height direction set as a y-axis, the value acquired by Equation 2 may be expressed in micrometers.

In the present specification, the surface roughness may also refer to a ten-point average roughness (Rz). The ten-point average roughness (Rz) expresses an average difference between the five highest peaks and the five deepest valleys by taking the reference length L as the cross-sectional curve and measuring intervals between the five highest peaks and the five deepest valleys with a straight line which does not transversely cut the cross-sectional curve and is parallel to an average line of the portion.

Meanwhile, as shown in an enlarged view in FIG. 5, according to the embodiment of the present invention, a concavo-convex pattern shallower than depths of the plurality of recesses R1 and the plurality of recesses R4 may be formed in wall surfaces of the plurality of recesses R1 formed in the first surface 530A of the semiconductor structure 530 and the plurality of recesses R4 formed in the other surface 520B of the first metal layer 520. Accordingly, the bonding area between the first surface 530A of the semiconductor structure 530 and the other surface 520B of the first metal layer 520 may further increase, and accordingly, the adhesion between the semiconductor structure 530 and the first metal layer 520 may be improved, and the possibility of generation of a crack between the semiconductor structure 530 and the first metal layer 520 due to the thermal expansion of the thermoelectric element may be reduced.

Meanwhile, as described above, the plurality of recesses R3 extending along the first direction may be formed in the one surface 520A of the first metal layer 520 facing the first conductive bonding layer 540. Accordingly, the surface 540A of the first conductive bonding layer 540 facing the first metal layer 520 may be arranged in the plurality of recesses R3 to be curved along a shape of the plurality of recesses R3. Accordingly, a bonding area between the first conductive bonding layer 540 and the first metal layer 520 may increase, and accordingly, adhesion between the first conductive bonding layer 540 and the first metal layer 520 may be improved.

In this case, at least one of an arithmetic average roughness (Ra) and a ten-point average roughness (Rz) of the plurality of recesses R3 formed in the one surface 520A of the first metal layer 520 facing the first conductive bonding layer 540 may be the same as or different from at least one of an arithmetic mean roughness (Ra) and a ten-point average roughness (Rz) of the plurality of recesses R4 formed in the other surface 520B of the first metal layer 520 facing the semiconductor structure 530. For example, for the plurality of recesses R3 formed in the one surface 520A of the first metal layer 520, the arithmetic average roughness (Ra) may be 0.6 to 1.2 µm, preferably 0.7 µm to 1.1 µm, and more preferably 0.7 µm to 0.9 µm, and the ten-point average roughness (Rz) may be 5.1 to 6.5 µm, preferably 5.15 µm to 6.4 µm, and more preferably 5.15 µm to 5.3 µm. Accordingly, due to the flowability of the first conductive bonding layer 540, the first conductive bonding layer 540 may be arranged to be curved along the concavo-convex shapes of the plurality of recesses R1, R3, and R4.

According to the embodiment of the present invention, at least one of the arithmetic average roughness (Ra) and the surface roughness (Rz) of the plurality of recesses R1 formed in the first surface 530A of the semiconductor structure 530 may be the same as or greater than at least one of the arithmetic average roughness (Ra) and the surface roughness (Rz) of the plurality of recesses R4 formed in the other surface 520B of the first metal layer 520. Further, at least one of the arithmetic average roughness (Ra) and the surface roughness (Rz) of the plurality of recesses R4 formed in the other surface 520B of the first metal layer 520 may be greater than at least one of the arithmetic average roughness (Ra) and the surface roughness (Rz) of the plurality of recesses R3 formed in the one surface 520A of the first metal layer 520 facing the first conductive bonding layer 540. This may depend on a topology change of the plurality of recesses in a process of plating the first metal layer 520 on the first surface 530A of the semiconductor structure 530 in which the plurality of recesses R1 are formed.

Figure 8:
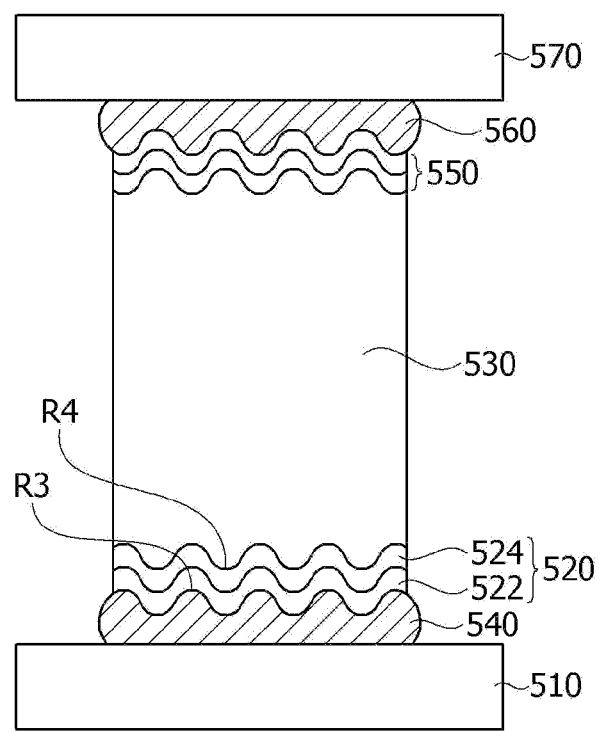
FIG. 8 is a cross-sectional view of a bonding structure between electrodes and a semiconductor structure in a thermoelectric element according to another embodiment of the present invention.

FIG. 8 is a cross-sectional view of a bonding structure between electrodes and a semiconductor structure in a thermoelectric element according to another embodiment of the present invention. Overlapping descriptions of the same content as the content described using FIGS. 5 to 7 will be omitted.

Referring to FIG. 8, a first metal layer 520 may include a plurality of first metal layers 522 and 524. For example, a 1-1 metal layer 522 includes nickel (Ni) and prevents diffusion of a semiconductor material in a semiconductor structure 530, for example, Bi or Te, and a 1-2 metal layer 524 includes tin (Sn) and may be bonded to a conductive bonding layer 540.

Like the above, when the first metal layer 520 includes the plurality of first metal layers 522 and 524, diffusion prevention performance and bonding performance of the first metal layer 520 may be further improved.

Figure 9:
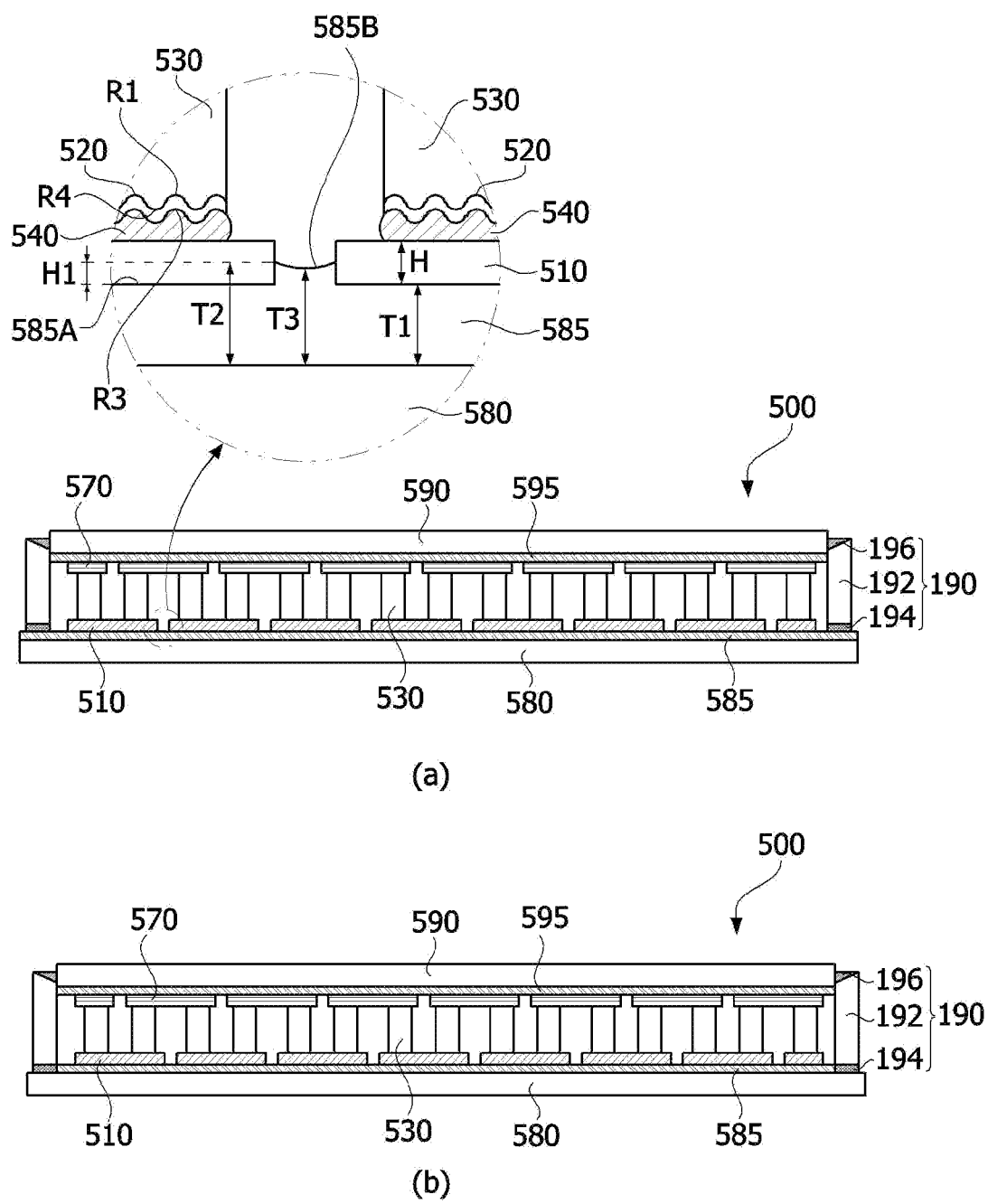
FIG. 9 is a cross-sectional view of the thermoelectric element according to one embodiment of the present invention.

FIG. 9 is a cross-sectional view of the thermoelectric element according to one embodiment of the present invention.

Referring to FIG. 9, a thermoelectric element 500 includes a first substrate 580, a first insulating layer 585 arranged on the first substrate 580, a first electrode 510 arranged on the first insulating layer 585, a first metal layer 520 arranged on the first electrode 510, a semiconductor structure 530 arranged on the first metal layer 520, and a first conductive bonding layer 540 arranged between the first electrode 510 and the first metal layer 520. Further, a second metal layer 550, a second conductive bonding layer 560, a second electrode 570, a second insulating layer 595, and a second substrate 590 may be sequentially stacked on the semiconductor structure 530.

A heat sink may be further arranged on the first substrate 580 or the second substrate 590, and a sealing member 190 may be further arranged between the first substrate 580 and the second substrate 590. Contents related to the first substrate 110, the second substrate 160, and the sealing member 190 described with reference to FIGS. 1 to 4 may be applied to contents related to the first substrate 580, the second substrate 590, and the sealing member 190.

Meanwhile, as shown in FIG. 9A, a sealing material 194 may come into contact with the first insulating layer 585 of the thermoelectric element 500. When thermal expansion coefficients of the first substrate 580 and the first insulating layer 585 are different from each other, delamination between the first substrate 580 and the first insulating layer 585 may occur due to a temperature difference between a high-temperature portion and a low-temperature portion, and when the sealing material 194 and the first insulating layer 585 come into contact with each other, the sealing material 194 may block the penetration of external moisture and foreign substances into the semiconductor structure 530 through the delamination between the first substrate 580 and the first insulating layer 585. Alternatively, as shown in FIG. 9B, when a width of the first insulating layer 585 of the thermoelectric element in a horizontal direction is arranged to be smaller than a width of the first substrate 580 in the horizontal direction for facilitating a process or improving a withstand voltage, the sealing material 194 may come into contact with both the first insulating layer 585 and the first substrate 580 of the thermoelectric element. Accordingly, reliability of the thermoelectric element may be improved by blocking the penetration of the moisture or foreign substances between the first insulating layer 585 and the first substrate 580.

Each of the first insulating layer 585 and the second insulating layer 595 may be formed of a resin layer including at least one of an epoxy resin composition including an epoxy resin and an inorganic filler and a silicone resin composition including polydimethylsiloxane (PDMS).

In this case, the first insulating layer 585 and the second insulating layer 595 are formed by a method of respectively applying a resin composition in an uncured state or a semi-cured state on each of the first substrate 580 and the second substrate 590, and arranging and pressing a plurality of pre-aligned first electrodes 510 and a plurality of pre-aligned second electrodes 570.

Accordingly, some of side surfaces of the plurality of first electrodes 510 may be embedded in the first insulating layer 585. In this case, a height H1 of each of the side surfaces of the plurality of first electrodes 510 embedded in the first insulating layer 585 may be 0.1 to 1 times, preferably 0.2 to 0.9 times, and more preferably 0.3 to 0.8 times a thickness H of each of the plurality of first electrodes 510. Like the above, when some of the side surfaces of the plurality of first electrodes 510 are embedded in the first insulating layer 585, contact areas between the plurality of first electrodes 510 and the first insulating layer 585 are widened, and accordingly, thermal transfer performance and bonding strength between the plurality of first electrodes 510 and the first insulating layer 585 may be further improved. When the height H1 of each of the side surfaces of the plurality of first electrodes 510 embedded in the first insulating layer 585 is less than 0.1 times the thickness H of each of the plurality of first electrodes 510, it may be difficult to acquire sufficient thermal transfer performance and bonding strength between the plurality of first electrodes 510 and the first insulating layer 585, and when the height H1 of each of the side surfaces of the plurality of first electrodes 510 embedded in the first insulating layer 585 exceeds 1 time the thickness H of each of the plurality of first electrodes 510, the first insulating layer 585 may rise to the top of the plurality of first electrodes 510, and accordingly, there is the possibility of an electrical short circuit.

More specifically, a surface of the first insulating layer 585 facing the first electrode 510 may include a first recess 585A and a second recess 585B, and the first electrode 510 may be arranged in the first recess 585A. Since the second recess 585B is arranged between the plurality of first electrodes 510, and a thickness of the first insulating layer 585 decreases from the side surface of each electrode to a center region in the second recess 585B, an apex may have a gentle 'V' shape, and may be shallower than a depth of the first recess 585A. Accordingly, the first insulating layer 585 between the plurality of first electrodes 510 may have a thickness variation, a height T2 in a region which comes into direct contact with the side surfaces of the plurality of first electrodes 510 may be the highest, and a height T3 in a center region may be lower than the height T2 in the region which comes into direct contact with the side surfaces of plurality of first electrodes 510. That is, the height T3 of the center region of the first insulating layer 585 between the plurality of first electrodes 510 may be the lowest in the first insulating layer 585 between the plurality of first electrodes 510. Further, a height T1 of the first insulating layer 585 under the plurality of first electrodes 510 may be lower than the height T3 of the center region of the first insulating layer 585 between the plurality of first electrodes 510.

As shown in the drawings, the plurality of recesses R1, R3, and R4 of the semiconductor structure 530 and the first metal layer 520 may be arranged to vertically overlap the first recess 585A of the first insulating layer 585 and not to vertically overlap the second recess 585B of the first insulating layer 585. Accordingly, since high bonding strength between the first insulating layer 585, the first electrode 510, and the semiconductor structure 530 may be acquired, a problem in that performance of the thermoelectric element is deteriorated due to thermal expansion may be prevented.

Meanwhile, the first insulating layer 585 may include a plurality of insulating layers. For example, although not shown in the drawings, the first insulating layer 585 may include a 1-1 insulating layer and a 1-2 insulating layer having different compositions, wherein the 1-1 insulating layer may be arranged on the first substrate 580, and the 1-2 insulating layer may be arranged between the 1-1 insulating layer and the first electrode 510. For example, the 1-1 insulating layer may include a composite including silicon and aluminum. Here, the composite may be at least one of an oxide, a carbide, and a nitride including silicon and aluminum. For example, the composite may include at least one of an Al—Si bond, an Al—O—Si bond, an Si—O bond, an Al—Si—O bond, and an Al—O bond. Like the above, the composite including at least one of the Al—Si bond, the Al—O—Si bond, the Si—O bond, the Al—Si—O bond, and the Al—O bond may have excellent insulation performance, and accordingly, high withstand voltage performance may be acquired. Meanwhile, the 1-2 insulating layer may be formed of a resin layer including at least one of an epoxy resin composition including an epoxy resin and an inorganic filler and a silicone resin composition including polydimethylsiloxane (PDMS). Accordingly, the 1-2 insulating layer may improve insulating properties, bonding strength, and thermal conductivity between the 1-1 insulating layer and the first electrode 510.

Like the above, when the first insulating layer 585 includes a plurality of insulating layers, the withstand voltage performance of the thermoelectric element 500 may be improved.

Meanwhile, an area of the 1-1 insulating layer and an area of the 1-2 insulating layer may be different from each other. For example, the area of the 1-1 insulating layer may be smaller than or equal to an area of the first substrate 580, and the area of the 1-2 insulating layer may be smaller than the area of the 1-1 insulating layer. For example, the 1-2 insulating layer may be arranged in a portion of the 1-1 insulating layer.

In this case, the first recess 585A and the second recess 585B of the first insulating layer 585 may be formed on the 1-2 insulating layer, and to this end, a thickness of the 1-2 insulating layer may be greater than a thickness of the 1-1 insulating layer.

Hereinafter, with reference to Table 1, results of testing the bonding performance of the thermoelectric element according to Comparative Example and Examples will be described.

TABLE 1

| Recess shape | | Example 1 regular | Example 2 regular | Comparative Example irregular |
|---|---|---|---|---|
| Metal layer(530B) | Ra(μm) | 0.81 | 1.04 | 0.55 |
| | Rz(μm) | 5.84 | 6.31 | 4.93 |
| Metal layer(530A) | Ra(μm) | 0.73 | 0.83 | 0.55 |
| | Rz(μm) | 5.25 | 5.19 | 5.02 |
| Adhesion test | | Pass | Pass | Fail |

Referring to Table 1, after manufacturing a specimen in which a metal layer having a thickness of 50 μm or less was arranged on a semiconductor structure having a thickness of 1 mm to have a surface roughness according to each of Example 1, Example 2, and Comparative Example, the adhesion between the semiconductor structure and the metal layer was tested. In an adhesion test, lattice patterns were formed on the metal layer arranged on the semiconductor structure at 1 mm intervals, and then were completely attached using a tape, and the tape was removed at an angle of 90 degrees at a speed of 1.6 cm/sec within two minutes. As a result, when the metal layer was delaminated less than 5%, the metal layer was regarded to have passed. Accordingly, it can be seen that the adhesion between the semiconductor structure and the metal layer in the thermoelectric element according to Examples of the present invention is excellent.

When the thermoelectric element or thermoelectric module according to the embodiment of the present invention is used in a transportation mechanism such as a ship, an automobile, or the like, power may be generated using waste heat discharged from an exhaust side of an engine, and generated energy may be stored in a battery of the transportation mechanism to be supplied to various devices in the transportation mechanism, for example, a lighting device, a gas circulation device, and the like. When the thermoelectric element according to the embodiment of the present invention is arranged at an intake side of the engine, the thermoelectric element according to the embodiment of the present invention may be used as a temperature control device as well as a power generation device. When the thermoelectric element according to the embodiment of the present invention is used as a temperature control device, the fuel efficiency of the engine may be improved by lowering the temperature of gas injected into the engine to increase the amount of gas injected into the engine. Accordingly, the engine in the transportation mechanism and the thermoelectric element according to the embodiment of the present invention may influence each other, and may have functional integrity or technical interoperability. Further, in the shipping industry and transportation industry using the transportation mechanism to which the thermoelectric element according to the embodiment of the present invention is applied, since a reduction in transportation costs and an eco-friendly industrial environment may be created due to the thermoelectric element according to the embodiment of the present invention, it is possible to achieve functional integrity or technical interoperability with the thermoelectric element according to the embodiment of the present invention.

When the thermoelectric element according to the embodiment of the present invention is used in a power plant, the efficiency of a used fuel compared to produced energy may be controlled using heat generated in the power plant, and accordingly, the thermoelectric element according to the embodiment of the present invention and the power plant may achieve functional integrity or technical interoperability by adjusting energy production costs and an eco-friendly industrial environment.

When the thermoelectric element according to the embodiment of the present invention is used in a plant such as a steel mill or the like, the consumption of energy used in the plant may be reduced by producing energy through power generation using waste heat generated in the plant, and when the thermoelectric element is used as a temperature control device, since temperature control is performed in the manufacturing step of a product or in the plant, it affects other components of the plant, and thus the thermoelectric element according to the embodiment of the present invention and other components of the plant may achieve functional integrity or technical interoperability.

The thermoelectric element according to the embodiment of the present invention may be used as a temperature sensor of a wireless network or a small power supply device for supplying energy to the sensor. That is, since permanent energy supply to the sensor the like may be achieved, the thermoelectric element may achieve functional integrity or technical interoperability with a wireless network system when used as a temperature sensor installed underground or a power supply device of the temperature sensor.

The thermoelectric element according to the embodiment of the present invention may be used as a temperature control device, and may achieve functional integrity or technical interoperability through a function of controlling the temperature of an electric vehicle or a battery charging device to improve the stability of the electric vehicle or the battery charging device when used in the electric vehicle, the battery charging device, or the like.

Although the exemplary embodiments of the present invention have been described above, it may be understood by those skilled in the art that a variety of modifications and changes may be made without departing from the concept and scope of the present invention disclosed within the range of the following claims.

The invention claimed is:
1. A thermoelectric element comprising:
a first electrode;
a metal layer arranged on the first electrode;
a semiconductor structure arranged on the metal layer; and
a conductive bonding layer arranged between the first electrode and the metal layer,
wherein the metal layer includes one surface facing the conductive bonding layer, and other surface facing the semiconductor structure,
the one surface of the metal layer includes a plurality of recesses concave toward the other surface of the metal layer,
each of the plurality of recesses extends in a first direction, and
one surface of the conductive bonding layer facing the metal layer is arranged in the plurality of recesses to be curved along a shape of the plurality of recesses.

2. The thermoelectric element of claim 1, wherein the first direction is a direction perpendicular to a second direction from the first electrode to the semiconductor structure.

3. The thermoelectric element of claim 1, wherein:
an arithmetic average roughness (Ra) of the plurality of recesses is 0.6 to 1.2 μm; and
a ten-point average roughness (Rz) of the plurality of recesses is 5.1 to 6.5 μm.

4. The thermoelectric element of claim 1, further comprising:
a first substrate; and
a first insulating layer arranged between the first substrate and the first electrode.

5. The thermoelectric element of claim 4, wherein a portion of the first electrode is embedded in the first insulating layer.

6. The thermoelectric element of claim 5, wherein:
one surface of the first insulating layer facing the first electrode includes a first recess and a second recess; and
the first electrode is arranged in the first recess.

7. The thermoelectric element of claim 6, wherein a depth of the second recess is shallower than a depth of the first recess.

8. The thermoelectric element of claim 7, wherein the plurality of recesses of the metal layer are arranged to vertically overlap the first recess of the first insulating layer and not to vertically overlap the second recess of the first insulating layer.

9. The thermoelectric element of claim 1, wherein:
the other surface of the metal layer is concave toward the one surface of the metal layer, and includes a plurality of recesses extending in the first direction; and
at least one of an arithmetic average roughness (Ra) and a ten-point average roughness (Rz) of the plurality of recesses of the one surface of the metal layer is different from at least one of the arithmetic average roughness (Ra) and the ten-point average roughness (Rz) of the plurality of recesses of the other surface of the metal layer.

10. A thermoelectric element comprising:
a first substrate;
a first insulating layer disposed on the first substrate;
a first electrode disposed on the first insulating layer;
a metal layer arranged on the first electrode;
a semiconductor structure arranged on the metal layer;
a conductive bonding layer arranged between the first electrode and the metal layer;
a second electrode disposed on the semiconductor structure;
a second insulating layer disposed on the second electrode; and
a second substrate disposed on the second insulating layer,
wherein the metal layer includes one surface facing the conductive bonding layer, and other surface facing the semiconductor structure,
the one surface of the metal layer includes a plurality of first recesses concave toward the other surface of the metal layer,
each of the plurality of first recesses extends in a first direction, and
one surface of the conductive bonding layer facing the metal layer is arranged in the plurality of first recesses to be curved along a shape of the plurality of first recesses.

11. The thermoelectric element of claim 10, wherein a first surface of the semiconductor structure arranged to face the first electrode is a concavo-convex surface having a plurality of second recesses formed to regularly extend in the first direction.

12. The thermoelectric element of claim 11, wherein the other surface of the metal layer arranged to face the semiconductor structure is arranged to be bent in the plurality of second recesses along a concavo-convex shape of the concavo-convex surface of the semiconductor structure.

13. The thermoelectric element of claim 12, wherein irregularities shallower than depths of the plurality of second recesses are formed on wall surfaces of the plurality of second recesses.

14. The thermoelectric element of claim 10, wherein the conductive bonding layer includes at least one of Sn and Sb, and the metal layer includes at least one of Ni, Sn, Pd and Mo.

15. The thermoelectric element of claim 10, wherein:
an arithmetic average roughness (Ra) of the plurality of first recesses is 0.6 to 1.2 µm; and
a ten-point average roughness (Rz) of the plurality of first recesses is 5.1 to 6.5 µm.

16. The thermoelectric element of claim 11, wherein:
one surface of the first insulating layer facing the first electrode includes a third recess and a fourth recess; and
the first electrode is arranged in the third recess.

17. The thermoelectric element of claim 16, wherein a depth of the fourth recess is shallower than a depth of the third recess.

18. The thermoelectric element of claim 17, wherein the plurality of first recesses of the metal layer are arranged to vertically overlap the third recess of the first insulating layer and not to vertically overlap the fourth recess of the first insulating layer.

* * * * *